US006683462B2

(12) United States Patent
Shimizu

(10) Patent No.: US 6,683,462 B2
(45) Date of Patent: Jan. 27, 2004

(54) APPARATUS FOR AND METHOD OF MEASURING CAPACITANCE WITH HIGH ACCURACY

(75) Inventor: Akira Shimizu, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/004,333

(22) Filed: Nov. 2, 2001

(65) Prior Publication Data

US 2002/0101251 A1 Aug. 1, 2002

(30) Foreign Application Priority Data

Nov. 30, 2000  (JP) ........................................ 2000-365039

(51) Int. Cl.$^7$ .............................................. G01R 27/26
(52) U.S. Cl. ....................................... 324/658; 324/679
(58) Field of Search ................................ 324/519, 548, 324/658, 660, 661, 679, 686, 662, 663, 677, 713, 765, 158.1

(56) References Cited

U.S. PATENT DOCUMENTS

| 4,022,990 A | * | 5/1977 | Bauer ........................... 379/24 |
| 4,968,946 A | * | 11/1990 | Maier .......................... 324/671 |
| 5,014,011 A | * | 5/1991 | Colvin ......................... 324/663 |
| 5,189,376 A | * | 2/1993 | Roberge et al. .............. 324/662 |
| 5,321,367 A | * | 6/1994 | Koscica et al. ............. 324/663 |
| 5,754,041 A |   | 5/1998 | Kaito et al. ............... 324/158.1 |

FOREIGN PATENT DOCUMENTS

JP          58121812         1/1982

\* cited by examiner

*Primary Examiner*—Walter E. Snow
*Assistant Examiner*—Vincent Q. Nguyen

(57) ABSTRACT

For measuring a capacitance with high accuracy, a capacitance measuring apparatus includes a voltage source with a current limiting function for applying different voltage values to the capacitance, and an integrator capable of continuous integrating operation for repeatedly integrating a current flowing through the capacitance at given periodic intervals. There is also disclosed a capacitance measuring method that is carried out by the capacitance measuring apparatus.

5 Claims, 6 Drawing Sheets

APPARATUS FOR AND METHOD OF MEASURING CAPACITANCE WITH HIGH ACCURACY

BACKGROUND OF THE INVENTION

1. Field of the Invention

The present invention relates to an apparatus for and a method of measuring capacitance with high accuracy.

2. Description of the Related Art

In the development of semiconductor devices and semiconductor fabrication processes, it has heretofore been customary to measure capacitance for the evaluation of the devices or processes. Capacitance is measured basically according to two principles: high frequencies measurement and quasi-static measurements. For quasi-static capacitance measurement, there has been a demand for a technique to measure capacitance with high accuracy because values of capacitance to be measured are small because semiconductor fabrication processes have become finer in recent years. Owing to the use of finer semiconductor fabrication processes, a large leakage current that causes errors in the measurement of quasi-static capacitance, and such a large leakage current needs to be compensated for.

Capacitance measurement processes that are primarily used in the art at present include a ramp voltage process and a step voltage process.

According to the ramp voltage process, a ramp voltage having a constant slew rate, which is a value produced by differentiating the voltage with respect to time, is applied to a capacitance to be measured, and the value of the capacitance is determined from a current I that is measured and the slew rate (dV/dt) according to the equation $C=Q/V=I \cdot dV/dt$. One significant shortcoming of the ramp voltage process is that it cannot compensate for any leakage current.

According to the step voltage process, a step voltage is applied to a capacitance to be measured. Specifically, a voltage applied to a capacitance to be measured is changed from a certain value $V_1$ to another value $V_2$ ($\Delta V=V_2-V_1$), and a current flowing through the capacitance over a certain period of time in which the voltage varies is integrated to determine a quantity $\Delta Q$ of electric charge that is stored in the capacitance depending on the voltage change. For example, leakage current $L_1$ at voltage $V_1$ and leakage current $L_2$ at voltage $V_2$ are measured. If it can be assumed that a leakage current in the integrating period is the average of leakage currents $L_1$ and $L_2$, then the capacitance Cx to be measured can be calculated according to the following equation:

$$Cx = \left\{ \int i dt - \left( \frac{L_2 + L_1}{2} \right) t_i \right\} / (V_2 - V_1)$$

where i represents the current value and $t_i$ represents the integrating time. The step voltage process is problematic, however, in that a transient current flowing when the voltage is changed may possibly exceed the dynamic range of the measuring system. The portion of the current that exceeds the dynamic range is responsible for a measurement error as it cannot properly be measured. Stated otherwise, different pieces of hardware need to be made available to handle various values of capacitance to be measured.

SUMMARY OF THE INVENTION

It is therefore an object of the present invention to provide an apparatus for and a method of measuring a capacitance with high accuracy by controlling a current flowing through the capacitance in view of the dynamic range of a measuring system in a step voltage process.

According to the present invention, there is provided an apparatus for measuring a capacitance, comprising a voltage source with a current limiting function for applying different voltage values to the capacitance, and an integrator capable of continuous integrating operation for repeatedly integrating a current flowing through the capacitance at constant periodic intervals. The integrator capable of continuous integration operation can output an integrated value for a certain period, resets the integration operation after having outputted the integrated value, and output an integrated value again after a next certain period. The integrator is capable of repeating the above operation. The voltage source with a current limiting function can limit the output voltage depending on a given current value.

The voltage source may comprise a variable-output voltage source, a variable-output current source, and a current detector which is selectively connectable to the variable-output voltage source and the variable-output current source depending on the value of a current flowing therethrough.

According to the present invention, there is also provided a method of measuring a capacitance, comprising the steps of imparting a voltage change from a voltage value to another voltage value to the capacitance while limiting a current flowing through the capacitance so that the current does not exceed a predetermined value, repeatedly integrating a current flowing through the capacitance at given periodic intervals during the voltage change and outputting integrated values, summing the outputted integrated values to determine a current value flowing through the capacitance in relation to the voltage change, and calculating a value of the capacitance based on the calculated current value.

DETAILED DESCRIPTION OF THE PREFERRED EMBODIMENTS

Figure 1:
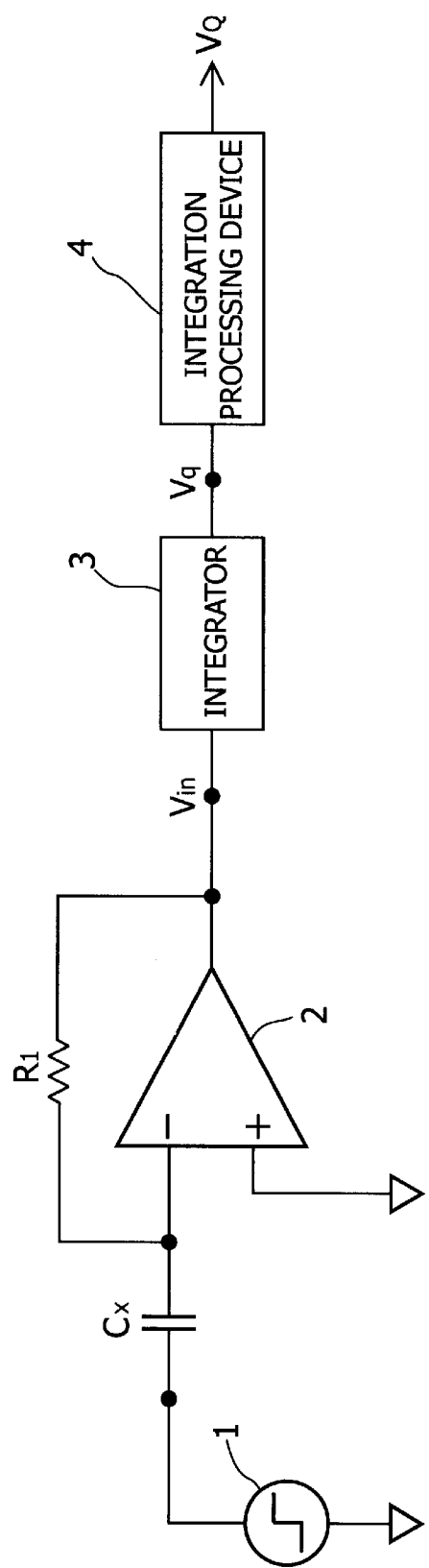
FIG. 1 is a functional diagram of a capacitance measuring apparatus according to the present invention.

A capacitance measuring apparatus according to the present invention will be described below with reference to FIG. 1. In FIG. 1, the capacitance measuring apparatus has a voltage source 1 for applying a step voltage of up to about 10 V to a capacitance Cx to be measured. As described later on, the voltage source 1 comprises a voltage source with a current limiting function. A current $I_{cx}$ flowing out of the capacitance Cx is supplied to a current-to-voltage converter 2 shunted by a resistor $R_1$, and is converted thereby into an output voltage $V_{in}$. The output voltage $V_{in}$ is applied to an integrator 3 capable of continuous integrating operation. Output values $V_q$ produced from the integrator 3 at periodic intervals are summed or integrated for a certain period according to a software program, calculating a voltage value $V_Q$ proportional to the capacitance Cx. The output value $V_q$ may be integrated by an appropriate processing device 4 which runs the software program.

Figure 2:
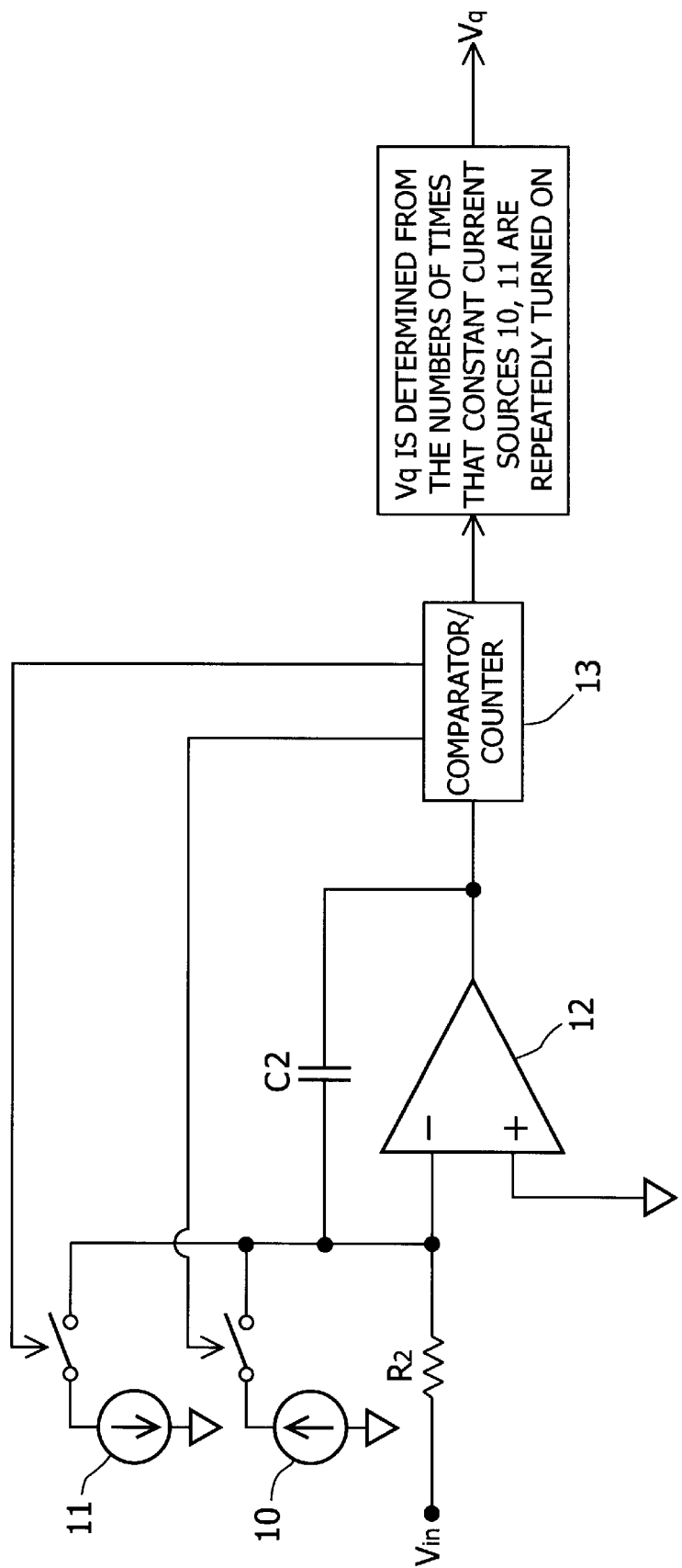
FIG. 2 is a circuit diagram, partly in block form, an integrator capable of continuous integrating operation in the capacitance measuring apparatus according to the present invention.

The integrator 3 capable of continuous integrating operation specifically comprises a circuit arrangement shown in FIG. 2. As shown in FIG. 2, the circuit of the integrator 3 comprises two constant current sources 10, 11 whose polarities are opposite to each other, an operational amplifier 12 shunted by a capacitor $C_2$ having a known capacitance, and a comparator/counter 13. When a voltage $V_{in}$ having a certain value is applied to the integrator 3, the constant current sources 10, 11 are repeatedly turned on and off for a certain period of time in order to cancel an electric charge injected into the capacitor $C_2$ under the applied voltage $V_{in}$, so that the output from the operational amplifier 12 remains unchanged. If the constant current source 10 produces an output current having an absolute value $I_0$ and the constant current source 11 produces an output current having an absolute value $I_1$, then the integrated value is represented by $XI_0 - YI_1$ where X and Y indicate the numbers of times that the respective constant current sources 10, 11 are repeatedly turned on. If $I_0 = I_1$, then X−Y represents a value in proportion to the output voltage $V_q$ of the integrator 3. The integrator 3 may be set to an operation mode for measuring an average voltage in a period of 10 mS or 20 mS. Therefore, the integrator 3 produces an output voltage $V_q$ in a certain period. Particularly, the period of 20 mS is preferable for the reduction of noise if a commercial power supply of 50 Hz is used. It is desirable that the period of the output voltage from the integrator 3 be variable depending on the capacitance and current that are measured.

The integrator 3 which is capable of continuous integrating operation is not limited to the circuit arrangement shown in FIG. 2, but may be replaced with a high-speed A/D converter for continuously outputting a digital value corresponding to the input voltage $V_{in}$ applied to the integrator 3, and a software program for integrating the digital value outputted from the high-speed A/D converter.

As described above, when the output value $V_q$ that is outputted at certain periodic intervals from the integrator 3 is summed or integrated by the integration processing device 4 for a certain period, the voltage value $V_Q$ proportional to the capacitance that is measured is produced. The reason that the input voltage $V_{in}$ is integrated by the integrator 3 that is capable of continuous integrating operation, and output values $V_q$ produced by the integrator 3 at certain periodic intervals are summed or integrated by the integration processing device 4 for a certain period is that different values of capacitance can be measured without the need for changing the measuring system hardware. Stated otherwise, for measuring a larger value of capacitance, output values produced by the integrator 3 as a result of its integrating operation repeated at periodic intervals are summed for a longer period. Therefore, there is no need to increase the dynamic ranges of the current-to-voltage converter 2 and the integrator 3. Consequently, the capacitance measuring apparatus is reduced in size, and the accuracy thereof for measuring capacitance is increased.

As described above with respect to the conventional processes, the problem of a leakage current occurs in an actual capacitance that is measured. It is thus necessary to measure leakage currents that flow through a capacitance being measured before and after a voltage change and to compensate for the measured leakage current.

Figure 3:
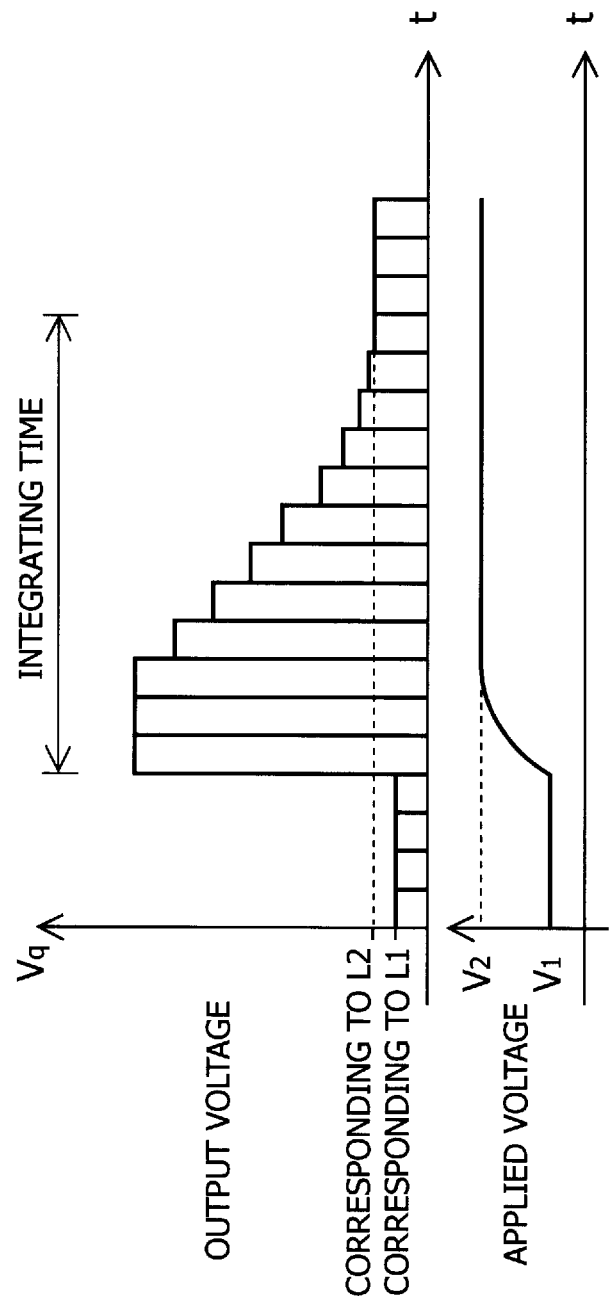
FIG. 3 is a graph showing output voltages from the integrator and input voltages applied to a capacitance to be measured, the graph being illustrative of operation of the capacitance measuring apparatus.

FIG. 3 shows the relationship between output voltages $V_q$ from the integrator 3 and input voltages applied to a capacitance to be measured, i.e., a voltage value $V_Q$ proportional to the capacitance that is measured which is produced by summing or integrating the output voltages $V_q$. It can be seen from FIG. 3 that there are leakage currents $L_1$, $L_2$ before and after the applied voltage changes. Since the current-to-voltage converter 2 is used, FIG. 3 shows voltage values corresponding to the leakage currents $L_1$, $L_2$, rather than the leakage currents $L_1$, $L_2$ directly. The current that flows initially at the time the voltage changes does not exceed the dynamic range of the measuring system because the voltage source 1 for applying a step voltage comprises a voltage source with a current limiting function, as described below.

Figure 4:
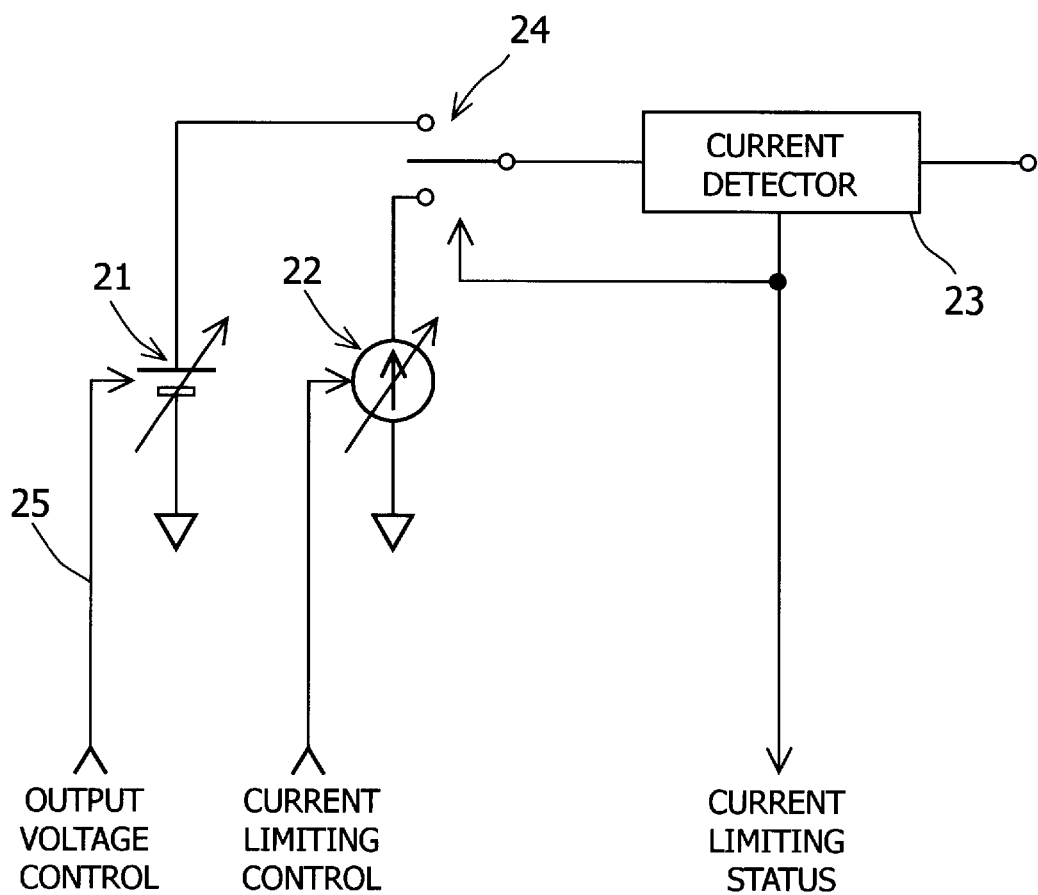
FIG. 4 is a circuit diagram of a voltage source with a current limiting function in the capacitance measuring apparatus.

FIG. 4 shows a voltage source with a current limiting function by way of example. As shown in FIG. 4, the voltage source comprises a variable-output constant voltage source 21, a variable-output constant current source 22, and a current detector 23 which is connected selectively to the constant voltage source 21 and the constant current source 22 by a switch 24. When an appropriate voltage value is applied by an operator or a control circuit via an output voltage control line 25 to the constant voltage source 21, the constant voltage source 21 outputs a voltage of the applied value. At this time, the switch 24 has its movable contact connected to the constant voltage source 21, allowing the output voltage from the constant voltage source 21 to be applied via the current detector 23 to the capacitance Cx to be measured. If the current detector 23 detects a current beyond a certain threshold, it controls the switch 24 to shift its movable contact to the constant current source 22. If the current detector 23 detects a current lower than the threshold, it controls the switch 24 to shift its movable contact to the constant voltage source 21 again, applying the voltage from the constant voltage source 21 to the capacitance Cx. The current detector 23 is not limited to a specific circuit arrangement, but may be of any of various processes or circuit arrangements including a digital processing arrangement comprising an A/D converter and a suitable software program or a known analog circuit arrangement.

The voltage source with a current limiting function operates to apply the voltage to the capacitance Cx, which, as shown in FIG. 3, gradually increases from a value $V_1$ to a certain value $V_2$. Since a sharply increasing step voltage is not applied to the capacitance Cx, no excess current flows through the capacitance Cx and exceeds the dynamic range of the measuring system.

Figure 5:
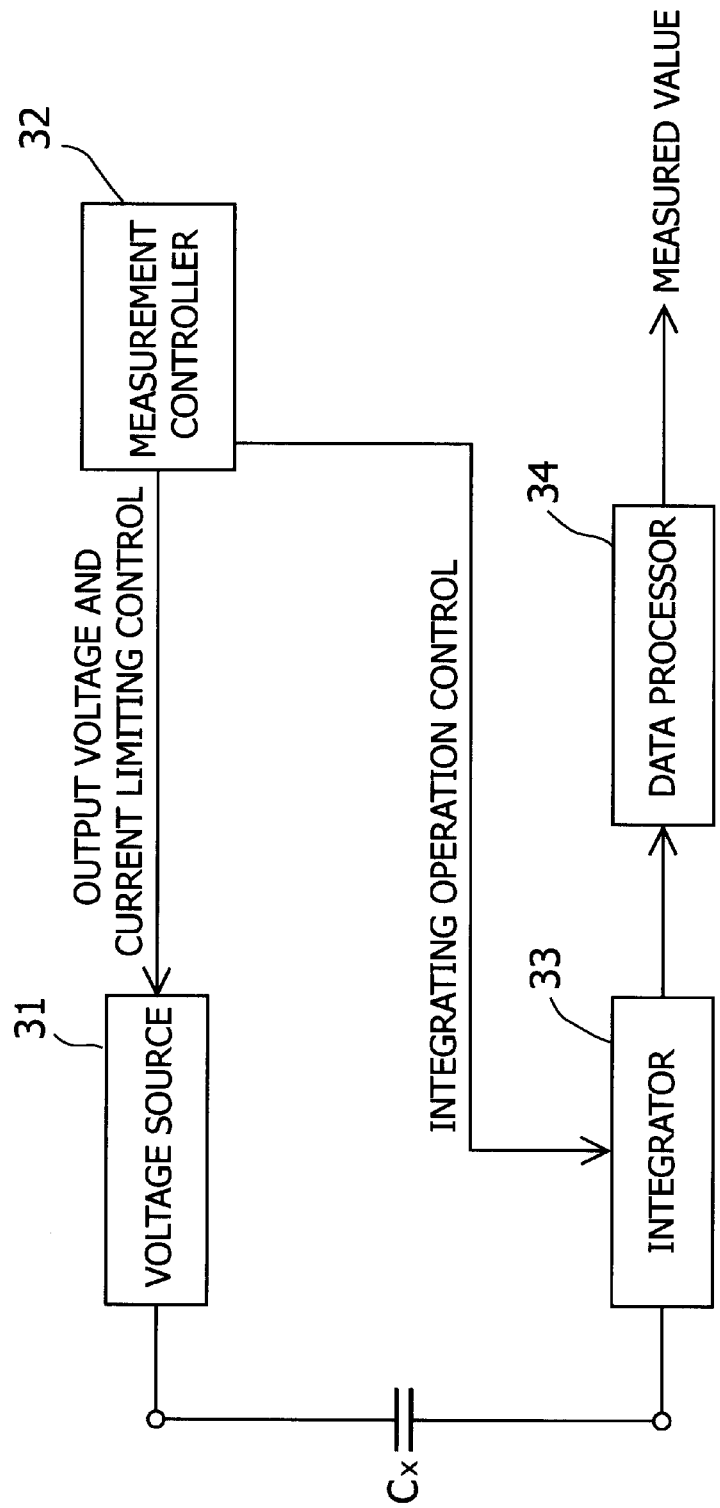
FIG. 5 is a functional block diagram of a capacitance measuring apparatus according to the present invention.

FIG. 5 shows in functional block form a capacitance measuring apparatus according to the present invention. In FIG. 5, a voltage source 31 with a current limiting function applies a step voltage, characterized by a change from a voltage $V_1$ to a voltage $V_2$, to the capacitance Cx to be measured. At this time, a measurement controller 32 monitors a current flowing through the voltage source 31 and controls the current so as not to exceed a certain current value. An output current from the capacitance Cx is integrated by an integrator 33 which is capable of continuous integrating operation. An output integrated value from the integrator 33 is processed by a data processor 34 for further integration and leak current compensation. The data processor 34 outputs a measured value.

Figure 6:
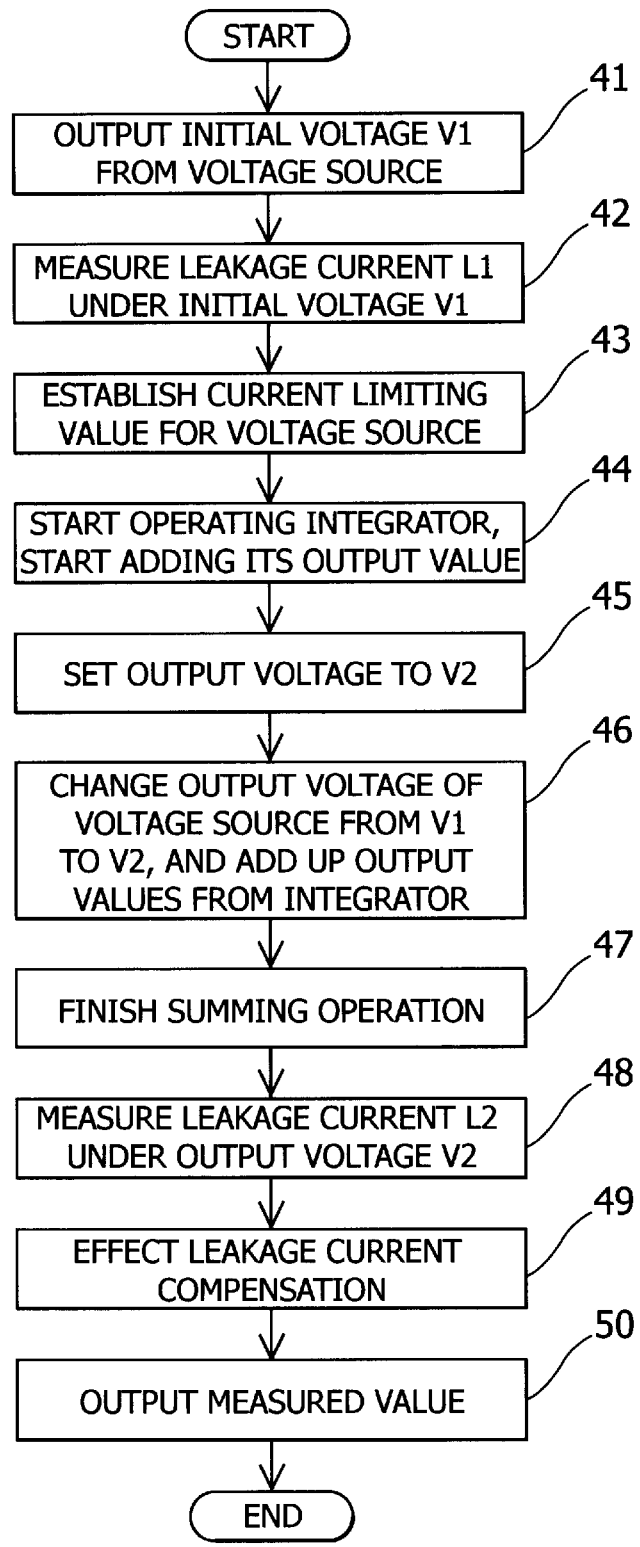
FIG. 6 is a flowchart showing a processing sequence of a capacitance measuring method according to the present invention, which is carried out by the capacitance measuring apparatus shown in FIG. 5.

A processing sequence of a capacitance measuring method according to the present invention, which is carried out by the capacitance measuring apparatus shown in FIG. 5 will be described below with reference to FIG. 6. The voltage source 31 outputs an initial voltage $V_1$ in step 41. A leakage current $L_1$ under the initial voltage $V_1$ is measured in step 42. Then, the measurement controller 32 establishes a current limit value for the voltage source 31 in step 43. The integrator 33 starts operating to integrate an output current from the capacitance Cx, and its output value starts to be added in step 44. An output voltage from the voltage source 31 is set to $V_2$ in step 45. While the voltage source 31 is being controlled by the measurement controller 32 to pass a current lower than the current limit value, the output voltage from the voltage source 31 changes from $V_1$ to $V_2$. Output values from the integrator 33 are summed for a sufficient period in step 46. Then, the summing operation is finished in step 47. A leakage current $L_2$ under the output voltage $V_2$ from the voltage source 31 is measured in step 48. Based on the summed value and the measured leakage currents $L_1$, $L_2$, a leakage current compensation is carried out in step 49. Then, a measured value of the capacitance Cx is outputted in step 50.

As described above, the present invention makes it possible to measure a capacitance with high accuracy.

The entire disclosure of Japanese Patent Application No. 2000-365039 filed on Nov. 30, 2000 including the specification, claims, drawings and summary are incorporated herein by reference in its entirety.

What is claimed is:

1. An apparatus for measuring a capacitance, comprising:
   a voltage source having a current limiting function and capable of applying different voltages to the capacitance, the voltage source comprising a variable-output voltage source, a variable-output current source, and a current detector that is selectively connectable to said variable-output voltage source or said variable-output current source depending on a current flowing therethrough; and
   an integrator capable of continuous integration operation for repeatedly integrating a current flowing through the capacitance at constant periodic intervals the integrator comprising two constant current sources whose polarities are opposite to each other and are each connected through a switch to an input of an operational amplifier shunted by a capacitor having a known capacitance, and a comparator/counter connected to an output of the amplifier for turning the switch on and off.

2. An apparatus according to claim 1, further comprising a current-to-voltage converter connected between said capacitance and said integrator for causing said integrator to integrate an output voltage from said current-to-voltage converter.

3. An apparatus according to claim 1, wherein the voltage source applies a step voltage.

4. A method of measuring a capacitance, comprising the steps of:
   imparting a voltage change from a voltage value to another voltage value to the capacitance while limiting a current flowing through the capacitance so that the current does not exceed a predetermined value using a voltage source which has a current limiting function comprising a variable-output voltage source, a variable-output current source, and a current detector which is selectively connectable to said variable-output voltage source or said variable-output current source depending on a current flowing therethrough;
   repeatedly integrating a current flowing through the capacitance at constant periodic intervals during the voltage change and outputting integrated values using an integrator comprising two constant current sources whose polarities are opposite to each other which are each connected through a switch to an input of an operational amplifier shunted by a capacitor having a known capacitance, and a comparator/counter connected to an output of the amplifier for turning the switch on and off;
   summing the outputted integrated values using the comparator/counter to determine a current value flowing through the capacitance in relation to said voltage change of the amplifier; and
   calculating a value of the capacitance based on the calculated current value.

5. A method according to claim 4, further comprising the steps of:
   converting the current flowing through the capacitance into a voltage; and
   repeatedly integrating the voltage converted from said current.

* * * * *